US005600590A

United States Patent [19]
Ghezzi et al.

[11] Patent Number: 5,600,590
[45] Date of Patent: Feb. 4, 1997

[54] PROCESS FOR THE MANUFACTURE OF AN INTEGRATED VOLTAGE LIMITER AND STABILIZER IN FLASH EEPROM MEMORY DEVICES

[75] Inventors: Paolo Ghezzi, Rivolta D'Adda; Alfonso Maurelli, Sulbiate, both of Italy

[73] Assignee: SGS-Thomson Microelectronics, S.r.l., Agrate Brianza, Italy

[21] Appl. No.: 477,302

[22] Filed: Jun. 7, 1995

Related U.S. Application Data

[62] Division of Ser. No. 301,792, Sep. 7, 1994.

[30] Foreign Application Priority Data

Sep. 10, 1993 [EP] European Pat. Off. .............. 93830365

[51] Int. Cl.⁶ .................................................... G11C 13/00
[52] U.S. Cl. ...................... 365/175; 365/185.33
[58] Field of Search ..................................... 365/175, 184, 365/185, 185.33, 178, 179, 189.01

[56] References Cited

U.S. PATENT DOCUMENTS

| | | | |
|---|---|---|---|
| 4,473,941 | 10/1984 | Turi et al. | 29/578 |
| 4,694,428 | 9/1987 | Matsumura et al. | 365/189.01 |
| 5,103,425 | 4/1992 | Kuo et al. | 365/226 |
| 5,170,232 | 12/1992 | Narita | 257/336 |
| 5,322,803 | 6/1994 | Cappeletti et al. | 437/27 |

FOREIGN PATENT DOCUMENTS

| | | | |
|---|---|---|---|
| 0359679 | 3/1990 | European Pat. Off. | H01L 21/329 |
| 0426241 | 5/1991 | European Pat. Off. | H01L 29/82 |
| 4024728 | 2/1991 | Germany | H01L 29/784 |
| 2284473 | 11/1990 | Japan | H01L 29/788 |

*Primary Examiner*—Terrell W. Fers
*Attorney, Agent, or Firm*—David V. Carlson; Harry K. Ahn; Seed and Berry LLP

[57] ABSTRACT

A process for the manufacture of an integrated voltage limiter and stabilizer component in a flash EEPROM memory device comprises a step of formation of an N type lightly doped well on a single-crystal silicon substrate; a step of formation of an active area on the surface of said N type well; a step of growth of a thin gate oxide layer over said active area; a step of implantation of a first heavy dose of N type dopant into said N type well to obtain an N type region; a step of implantation of a second heavy dose, higher than said first heavy dose, of N type dopant into said N type region to obtain an N+contact region to both the N type well and said N type region; a step of implantation of a third heavy dose, higher than said first heavy dose, of P type dopant into said N type region to form a P+ region.

8 Claims, 5 Drawing Sheets

PROCESS FOR THE MANUFACTURE OF AN INTEGRATED VOLTAGE LIMITER AND STABILIZER IN FLASH EEPROM MEMORY DEVICES

CROSS-REFERENCE TO RELATED APPLICATION

This application is a division of U.S. Pat. application Ser. No. 08/301,792, filed Sep. 7, 1994.

TECHNICAL FIELD

The present invention relates to a process for the manufacture of an integrated voltage limiter and stabilizer in flash EEPROM memory devices.

BACKGROUND OF THE INVENTION

Electrically erasable and programmable memory devices, such as EEPROM and flash EEPROM, must handle and control relatively high internal voltages, assuring at the same time a high degree of stability. In order to accomplish a programming or an erasing operation, a voltage of 12 V or morn must be supplied to the memory cells.

It is therefore advisable to provide such devices with integrated components suitable to both limit any possible overvoltage, which could damage the memory cells or the circuitry connected to them, and stabilize internal voltages against temperature variations and statistical distribution of the process parameters. These components become essential for memory devices belonging to particular logic families, such as 5 V-only devices, wherein the voltage necessary for programming and erasing the memory cells is generated internally.

Integrated voltage limiters are commonly obtained in MOS devices by means of chains of reverse-biased planar junction diodes or diode-connected MOS transistors. Both these solutions have drawbacks. In the case of a chain of reverse-biased junction diodes, the overall clamping voltage, even if it shows a small dependence on the temperature and on the process parameters, is affected by a decrease with tune due to the injection of charge in the oxide layer covering the junction surface (walk-out phenomenon). In the case of a chain of diode-connected MOS transistors, instead, the overall clamping voltage depends on both the temperature and the variations of the process parameters due to their statistical distribution.

European Patent Application No. 0426241 describes a process for the manufacture of a zener diode to limit and stabilize the programming voltage supplied to EEPROM memory cells, suitable to be integrated with the EEPROM memory cells in a single chip. However, the process does not involve additional steps with respect to those usually necessary for the accomplishment of EEPROM memory cells. The junction subjected to break down is constituted by a P+region, with a dopant concentration of $10^{20}$ atoms/cm$^3$ obtained in a process step corresponding to the implantation of source and drain areas of the P-channel transistors, and by an N- region, with a dopant concentration of $10^{19}$ atoms/cm$^3$ obtained in a process step corresponding to the implantation of condensers of the EEPROM cells. This last step requires a lithographic mask, and is performed before the gate oxide layer is formed.

Because the manufacture of EEPROM and flash EEPROM memory devices involves different fabrication processes, the integration of the zener diode described in the cited Patent Application in a flash EEPROM memory device requires additional process steps with respect to those usually necessary for the accomplishment of a flash EEPROM, namely the step of implantation of condensers.

SUMMARY OF THE INVENTION

In view of the state of art described, the object of the present invention is to accomplish a process for the manufacture of an integrated component suitable to limit the overvoltages and to stabilize the internal voltages in flash EEPROM memory devices, but also employable in EEPROM, which assures a clamping voltage stable over time and independent as far as possible from temperature and process parameters variations, said process requiring no additional steps with respect to the usual process utilized for the accomplishment of flash EEPROM memory devices.

According to the present invention, these objectives are attained by means of a process for the manufacture of an integrated voltage limited and stabilizer component comprising the following steps:

a) forming an N type lightly doped well on a single-crystal silicon substrate;

b) forming an active area on the surface of said N type well;

c) growing a thin gate oxide layer over said active area;

d) implanting a first heavy dose of N type dopant into said N type well to obtain an N type region;

e) implanting a second heavy dose, higher than said first heavy dose, of N type dopant into said N type region to obtain an N+contact region to both the N type well and said N type region; and f) implanting a third heavy dose, higher than said first heavy dose, of P type dopant into said N type region to form a P+region.

The present invention exploits some steps of the process usually employed to manufacture flash EEPROM memory devices in order to obtain a zener diode suitable to stabilize the programming/erasing voltage applied to the memory cells against temperature and process parameters variations, and to limit any possible overvoltage. More particularly, step a) is normally necessary to obtain P-channel MOS transistors, step b) is carried out to define the areas wherein MOS transistors and memory cells are to be obtained, and step c) is inherent to the fabrication of the flash EEPROM memory cells. Step d) is coincident with the step of implantation of N type dopants into the source region of the flash EEPROM cells. Step e) corresponds to the step of implantation of N type dopants into the source and drain regions of N-channel transistors. Step f) corresponds to the step of implantation of P type dopants into the source and drain regions of P-channel transistors.

In the zener diode obtained by means of the process according to the invention, the junction made to break down is represented by a P+region having a dopant concentration identical to that of the source and drain regions of P-channel transistors, and by an N region having a dopant concentration lower than that of the source and drain regions of N-channel transistors. This allows obtaining zener diodes with higher breakdown voltages, typically 5 V, whereas conventional zener diodes, whose cathode region is obtained by exploiting the implantation step that also forms the source and drain regions of N-channel transistors, have breakdown voltages of about 2.5. V.

BRIEF DESCRIPTION OF THE DRAWINGS

The features of the present invention shall be made more evident by the following detailed description of two embodiments, illustrated as non-limiting examples in the annexed drawings, wherein.

DETAILED DESCRIPTION OF THE INVENTION

Figure 3:
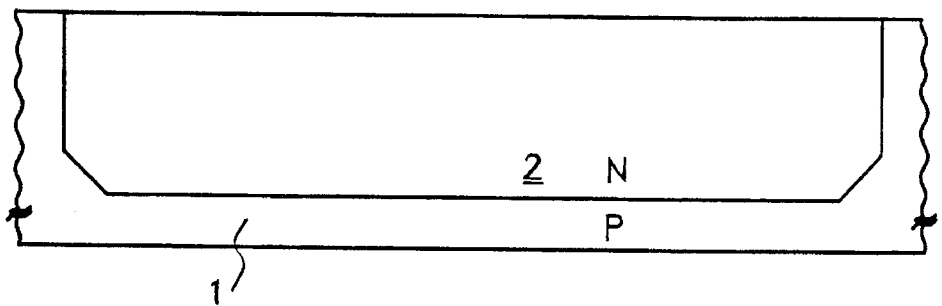
FIGS. 3 to 8 show a succession of process steps for the accomplishment of the zener diode of FIG. 1.

With reference to FIGS. 1 and 3 to 8, into a semiconductor substrate 1, for example of the P conductivity type, there is created, by means of implantation of phosphor ions in a dose of about $7*10^{12}$ atoms/cm$^2$, a lightly doped N type well 2 (FIG. 3).

Figure 4:
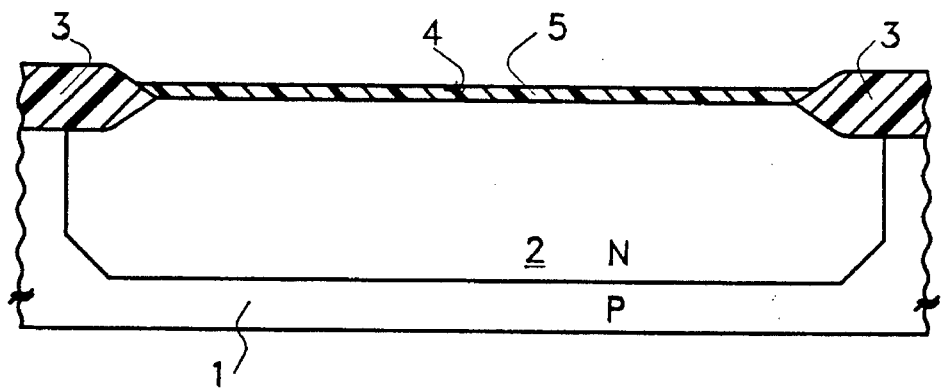

A successive step provides for the selective creation of a thick field oxide layer 3 over the surface of the semiconductor substrate 1. The portion of the substrate surface not covered by the field oxide layer 3 defines an active area region 4. A thin gate oxide layer 5 is then made to grow over the substrate surface (FIG. 4).

Figure 5:
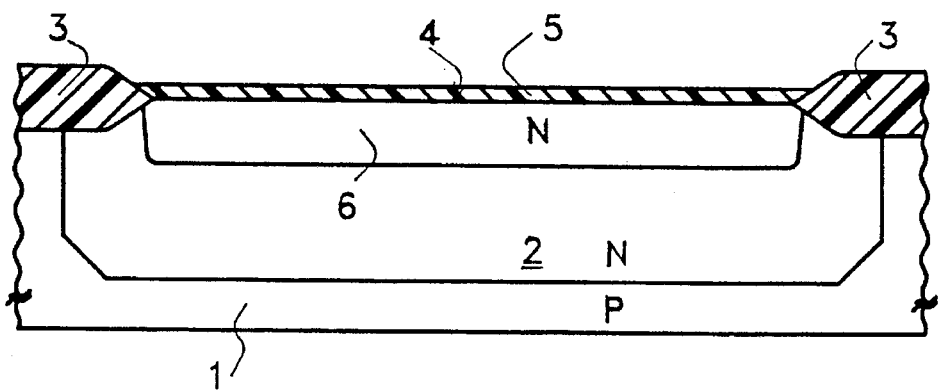

After the etching of the thin gate oxide layer 5, N type dopant ions are implanted into the N type well 2 to form an N type region 6 (FIG. 5). This step corresponds to the step of implantation of phosphor ions into the source regions of flash EEPROM memory cells (not shown), the dose of implanted ions being typically $10^{15}$ atoms/cm$^2$. The N type region 6, much more heavily doped than the N type well 2, will constitute a cathode region for the zener diode to be fabricated.

Figure 1:
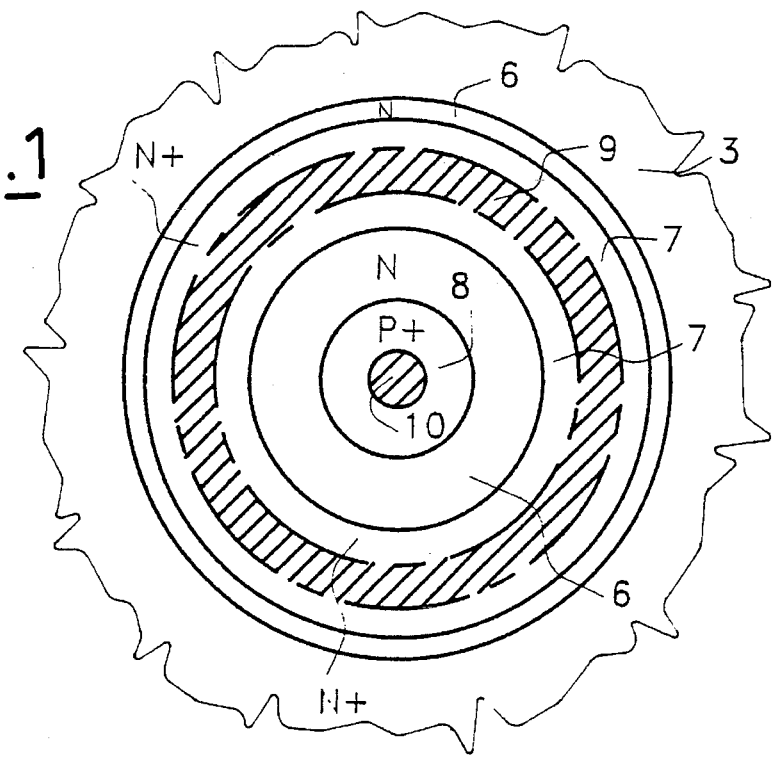
FIG. 1 is a top plan view of a zener diode according to one embodiment of the present invention, at the level of the silicon surface.
Figure 6:
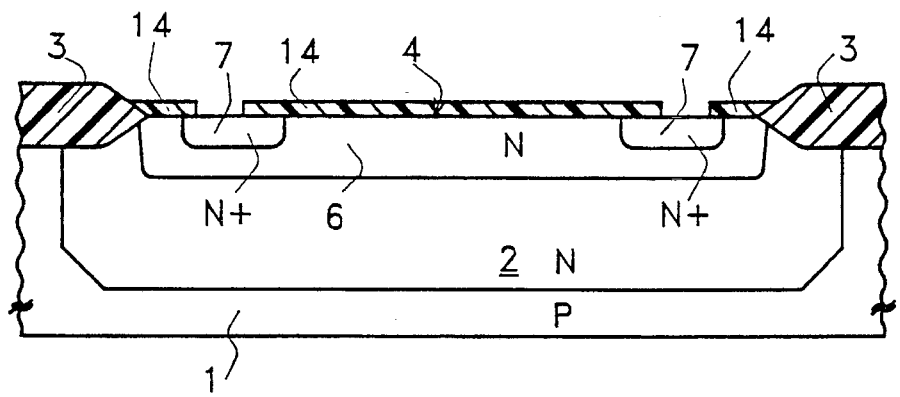

In a successive step, after the creation of an oxide layer 14 by means of oxide deposition and etching or alternatively by means of reoxidation, a heavy dose of N type dopant ions is implanted into the N type region 6 to form an N+region 7 (FIG. 6). As shown in FIG. 1, the N+region 7 has an annular shape, and is suitable to provide contact areas to the N type region 6 and to the N type well 2. This step corresponds to the step of implantation or arsenic ions into the source and drain regions of N-channel transistors (not shown), the dose of implanted ions being typically $5*10^{15}$ atoms/cm$^2$.

Figure 7:
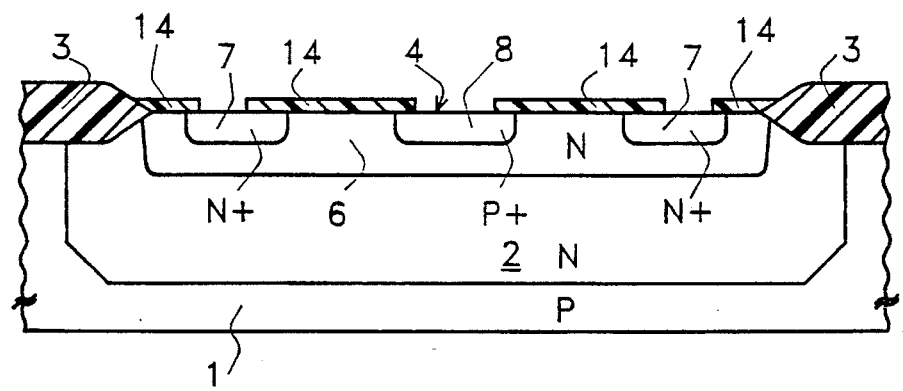

A heavy dose of P type dopant ions is then implanted into the N type region 6 to form a P+region 8 which will constitute an anode region of the zener diode (FIG. 7). This step corresponds to the step of implantation of boron ions into the source and drain regions of P-channel transistors (not shown), the implanted dose being typically $2.5*10^{15}$ atoms/cm$^2$, and can alternatively be performed before the above described step of FIG. 6.

Figure 8:
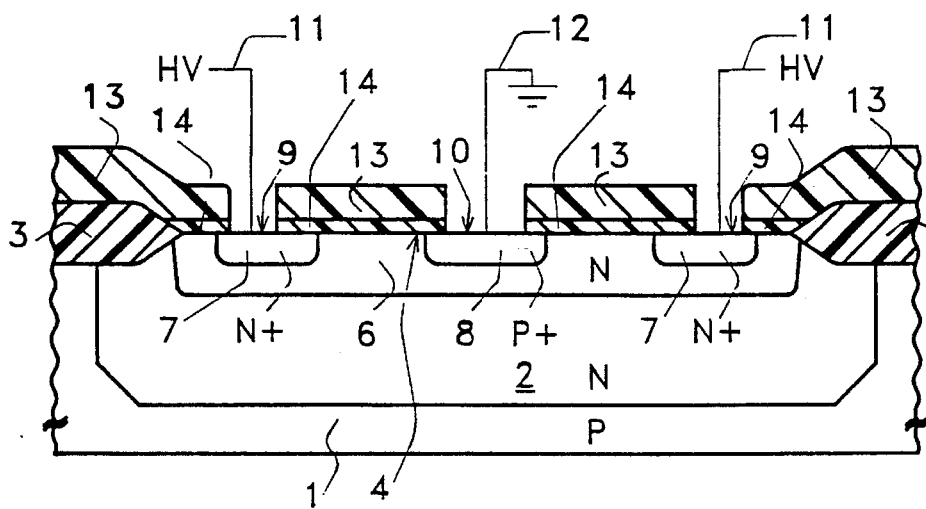

The final steps of the process provide, in a conventional way, for the deposition of a dielectric layer 13, for the creation of electrical contacts 9 and 10 to the N+annular region 7 and to the P+region 8, respectively, for the deposition of electrical interconnections lines 11 and 12, and for the passivation of the entire surface of the semiconductor substrate (FIG. 8). The N+annular region 7 will be connected, by means of the interconnection line 11, to a high voltage power supply line HV (either supplied externally to the flash EEPROM memory device or internally generated by a voltage booster in the case of a 5 V-only device), while the P+region 8 will be connected by means of the interconnection line 12 to a ground reference voltage.

FIGS. 2 and 9 to 16 show a second embodiment of the present invention for obtaining a gated zener diode. The fabrication process shown in FIGS. 9 to 16 comprises all the steps described with reference to the first embodiment of the invention plus one intermediate step typical of the manufacturing process of flash EEPROM memory cells, and consequently does not imply additional process steps.

Figure 9:
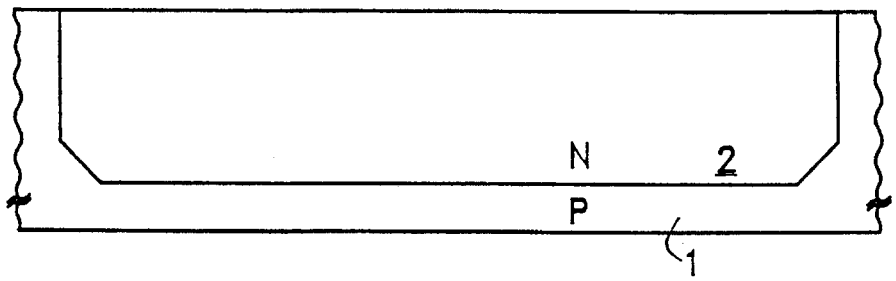
FIGS. 9 to 16 show a succession of process steps for the accomplishment of the zener diode of FIG. 2.
Figure 10:
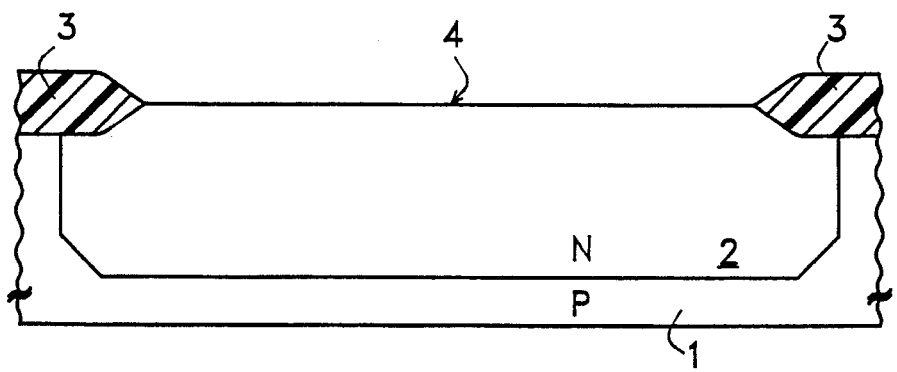

FIGS. 9 and 10 respectively show the creation of the N type well 2 into the P type semiconductor substrate 1, and the formation of the active area region 4 defined by a portion of the substrate surface not covered by the thick field oxide layer 3.

Figure 2:
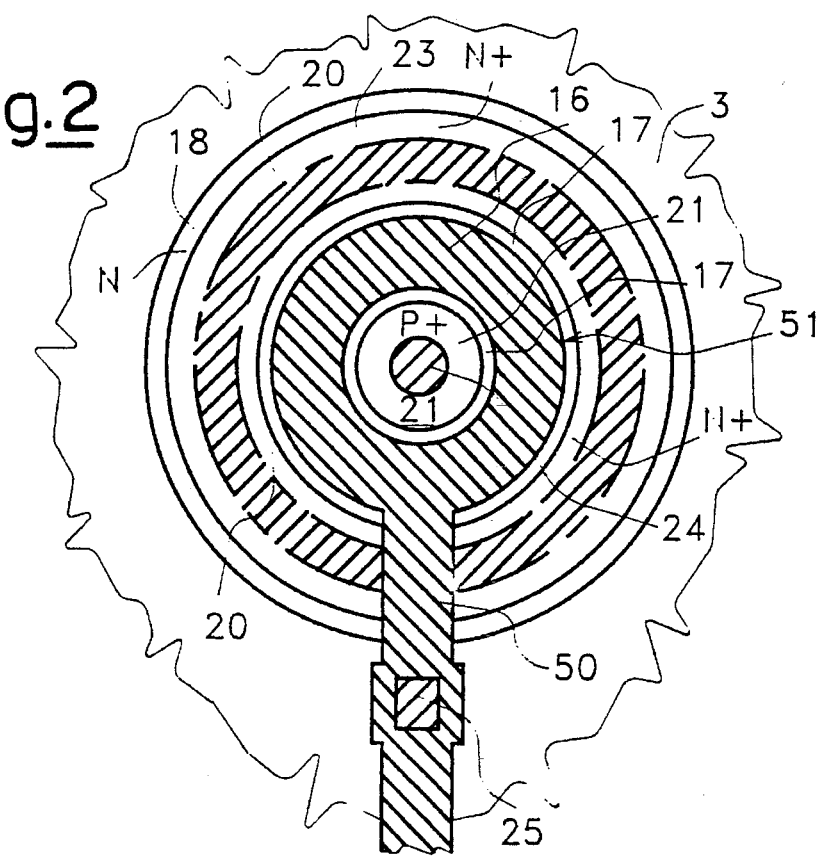
FIG. 2 is a top plan view of a zener diode according to another embodiment of the present invention.
Figure 11:
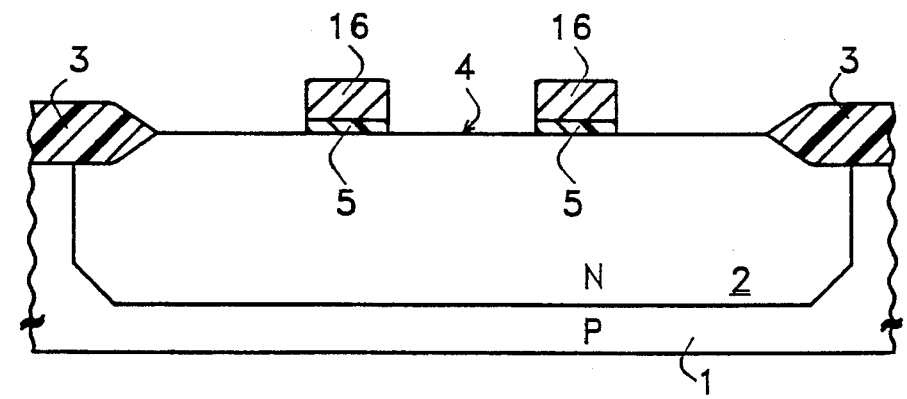

A thin gate oxide layer 5 is grown over the semiconductor surface, and a polysilicon layer 15 is deposited over the gate oxide layer 5. The polysilicon layer 15 is then doped to increase its conductivity, and, together with the underlying gate oxide layer 5, is selectively etched to form a polysilicon strip 51 having a ring portion 16 inside the active area region 4, with a lateral extension 50 (FIGS. 2 and 11).

Figure 12:
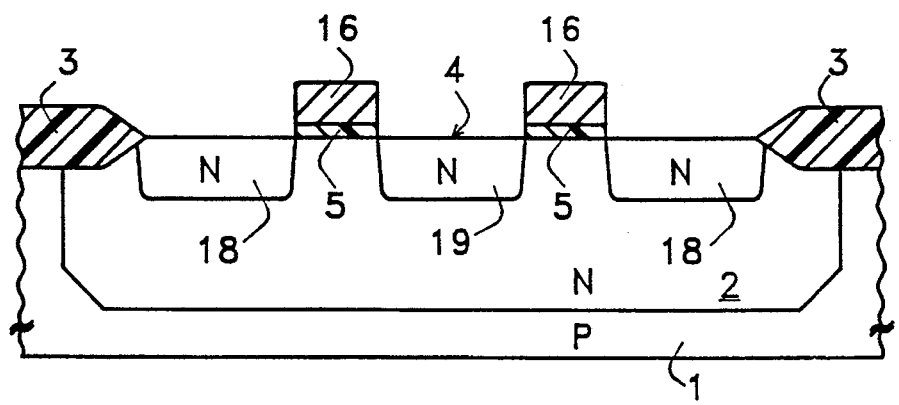

N type dopant ions are then implanted into the N type well 2, with the polysilicon strip 51 acting as a mask for the implanted ions. This step corresponds to the formation of the N type region 6 in the previous embodiment of the invention, and gives rise to an N type region made up of a substantially ring-shaped region 18 external to the ring portion 16 of the polysilicon strip 51, and of a circular region 19 internal to said ring portion 16 (FIG. 12).

Figure 13:
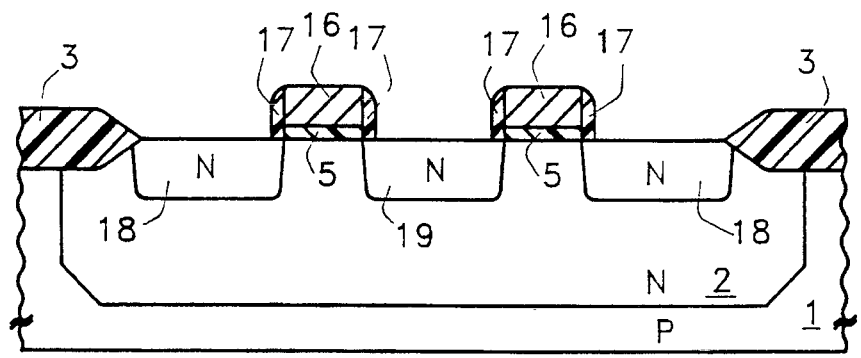
Figure 14:
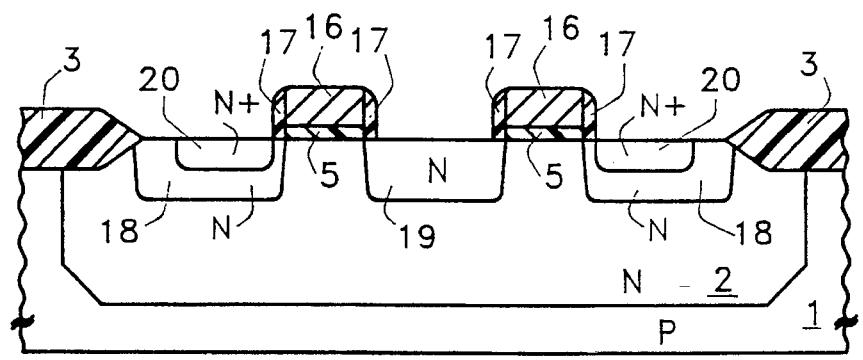
Figure 15:
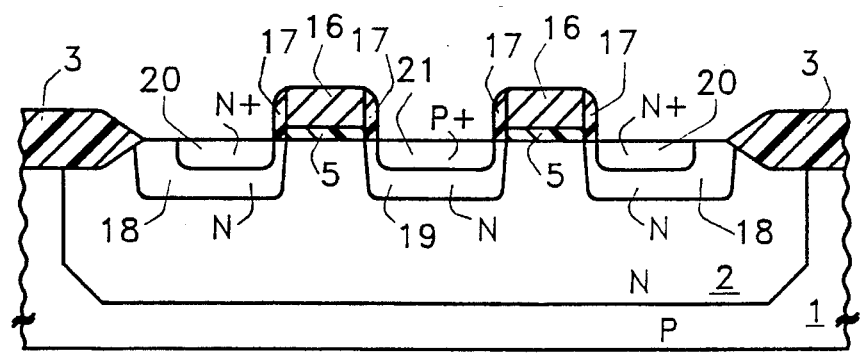

An oxide deposition and etching step, or alternatively a reoxidation step, allows the formation of spacers 17 at the edges of the polysilicon strip 51 (FIG. 13). A successive implant of N type dopant ions into the N type region 18 allows the formation of a substantially ring-shaped N+region 20 (FIG. 14). This step is carried out simultaneously with the implantation step into the source and drain regions of the N-channel transistors (not shown), as already described with reference to the first embodiment of the invention.

Exploiting the implantation step into the source and drain regions of the P-channel transistors (not shown), a heavy dose of P type dopant ions is then implanted into the N type circular region 19, to form a P+region 21 which will constitute an anode region of the gated zener diode. The presence of the spacers 17 makes it possible to obtain a P+region completely surrounded by the N type region 19, so that the junction subjected to breakdown is represented by the P+region 21 and by the N type region 19. This allows obtaining a zener diode with a stable clamping voltage of about 5 V.

Figure 16:
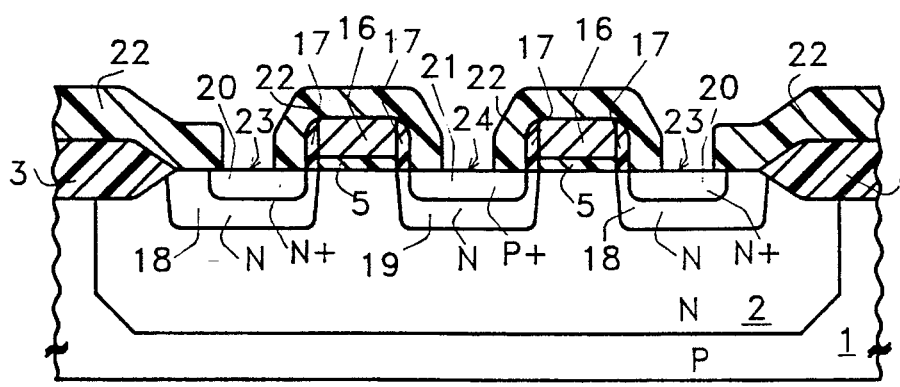

The final steps are conventional and provide for the deposition of a dielectric layer 22 over the semiconductor surface, for the definition of contact areas 23, 24 and 25 to the ring-shaped N+region 20, to the P+region 21 and to the lateral extension 50 of the polysilicon strip, respectively, and for the formation of electrical interconnection lines (not shown) (FIG. 16). The N+region 20 will be connected to the high voltage supply, while an interconnection line will connect the P+region 21 and the polysilicon strip 51 to the reference ground voltage. The entire semiconductor surface is then passivated.

The gated zener diode thus obtained improves the features of the zener diode of the first embodiment of the invention, because the polysilicon strip 51, shortcircuited with the P+anode region 21, relaxes the superficial electric field and causes the breakdown to occur at a greater depth, thus improving the stability of the clamping voltage value.

While the process according to the present invention has been described in connection with the manufacturing of flash EEPROM memory devices, it can also be employed to obtain, without additional process steps, zener diodes integrated in some EEPROM memory devices.

We claim:

1. A flash EEPROM memory device with integrated voltage limiter and stabilizer components, the memory device comprising:

a plurality of flash EEPROM memory cells;

a plurality of N-channel transistors;

a plurality of P-channel transistors; and a plurality of voltage limiter and stabilizer components with each limiter and stabilizer component having a cathode region and an anode region, the cathode regions of said voltage limiter and stabilizer components being formed simultaneously with source regions of said flash EEPROM memory cells, the anode regions of said voltage limiter and stabilizer components being formed simultaneously with active areas of said P-channel transistors.

2. The memory device of claim 1 wherein each of said voltage limiter and stabilizer components comprises a zener diode.

3. The memory device of claim 1 wherein:

said flash EEPROM memory cells have source regions of a first conductivity type having a first dopant concentration;

said N-channel transistors have source and drain regions of a first conductivity type having a second dopant concentration higher than the first dopant concentration;

said P-channel transistors have source and drain regions of a second conductivity type having a third dopant concentration between the first and second dopant concentrations; and said voltage limiter and stabilizer components have cathode regions of a first conductivity type having a first dopant concentration and anode regions of a second conductivity type having a third dopant concentration.

4. The memory device of claim 1 wherein said voltage limiter and stabilizer components have breakdown voltages of about 5 V.

5. An integrated circuit structure for a flash EEPROM memory device with an integrated voltage limiter and stabilizer component, the circuit structure comprising:

a substrate of semiconductor material of a first conductivity type, said substrate having a first dopant concentration and a top surface;

a well of semiconductor material of a second conductivity type formed at the top surface of said substrate, said well having a second dopant concentration and a top surface;

a first region of a second conductivity type formed at the top surface of said well, said first region having a third dopant concentration and a top surface, the third dopant concentration being higher than the second dopant concentration;

a second region of a second conductivity type formed at the top surface of said well, said second region being spaced from said first region and having a third dopant concentration and a top surface, said second region being a cathode region of said voltage limiter and stabilizer component;

a third region of a second conductivity type formed at the top surface of said first region, said third region having a fourth dopant concentration higher than the third dopant concentration; and a fourth region of a first conductivity type formed at the top surface of said second region, said fourth region having a fifth dopant concentration higher than the first dopant concentration, said fourth region being an anode region of said voltage limiter and stabilizer component.

6. The integrated circuit structure of claim 5 wherein said voltage limiter and stabilizer component comprises a gated zener diode.

7. The integrated circuit structure of claim 5 wherein said fourth region is bounded at its bottom and sides by said second region.

8. The integrated circuit structure of claim 5 wherein the first conductivity is P-type and the second conductivity is N-type.

* * * * *